US012620555B2

(12) United States Patent
Schlechte et al.

(10) Patent No.: US 12,620,555 B2
(45) Date of Patent: May 5, 2026

(54) SYSTEMS AND METHODS FOR PLASMA PROCESS

(71) Applicant: Tokyo Electron Limited, Tokyo (JP)

(72) Inventors: Charles Schlechte, Austin, TX (US); Jianping Zhao, Austin, TX (US); John Carroll, Austin, TX (US); Peter Lowell George Ventzek, Austin, TX (US)

(73) Assignee: TOKYO ELECTRON LIMITED, Tokyo (JP)

( * ) Notice: Subject to any disclaimer, the term of this patent is extended or adjusted under 35 U.S.C. 154(b) by 878 days.

(21) Appl. No.: 17/804,496

(22) Filed: May 27, 2022

(65) Prior Publication Data

US 2023/0386789 A1     Nov. 30, 2023

(51) Int. Cl.
*H01J 37/32* (2006.01)

(52) U.S. Cl.
CPC .. *H01J 37/32183* (2013.01); *H01J 37/32926* (2013.01); *H01J 37/3299* (2013.01); *H01J 2237/24564* (2013.01); *H01J 2237/332* (2013.01); *H01J 2237/334* (2013.01)

(58) Field of Classification Search
CPC ....... H01J 2237/24564; H01J 37/32183; H01J 37/32926; H01J 37/3299
See application file for complete search history.

(56) References Cited

U.S. PATENT DOCUMENTS

| | | | |
|---|---|---|---|
| 5,223,457 A * | 6/1993 | Mintz ............... | H01J 37/32082 |
| | | | 427/574 |
| 5,383,019 A * | 1/1995 | Farrell ................... | G01N 21/73 |
| | | | 250/288 |
| 5,618,382 A * | 4/1997 | Mintz ..................... | H05H 1/46 |
| | | | 134/1.1 |
| 6,043,607 A * | 3/2000 | Roderick ................. | H05H 1/46 |
| | | | 315/111.21 |
| 6,740,842 B2 * | 5/2004 | Johnson ................... | H05H 1/46 |
| | | | 156/345.45 |
| 7,019,543 B2 | 3/2006 | Quon | |
| 8,264,154 B2 | 9/2012 | Banner et al. | |
| 8,710,926 B2 | 4/2014 | Nagarkatti et al. | |
| 9,030,101 B2 | 5/2015 | Valcore, Jr. et al. | |
| 11,496,059 B2 * | 11/2022 | Fink ................. | H02M 3/33584 |
| 2003/0141821 A1 * | 7/2003 | Nakano ............. | H01J 37/32183 |
| | | | 315/111.21 |
| 2005/0069651 A1 | 3/2005 | Miyoshi et al. | |
| 2012/0145322 A1 * | 6/2012 | Gushiken .............. | H01J 37/321 |
| | | | 156/345.28 |

(Continued)

*Primary Examiner* — Jaehwan Oh
(74) *Attorney, Agent, or Firm* — Slater Matsil, LLP

(57)     ABSTRACT
A method of performing a plasma process includes generating, at an output of a signal generator, a first RF signal at a first frequency. The signal generator is coupled to a plasma chamber through a matching circuit. Based on a feedback from the first RF signal, variable components of the matching circuit are moved to fixed positions. A second RF signal is generated at a second frequency at the output of the signal generator to ignite a plasma within the plasma chamber. In response to detecting the plasma, the signal generator switches to output a third RF signal at the first frequency to sustain the plasma, which is configured to process a substrate loaded into the plasma chamber while holding the matching circuit at the fixed positions.

20 Claims, 14 Drawing Sheets

(56)  References Cited

U.S. PATENT DOCUMENTS

| 2014/0367043 | A1 | 12/2014 | Bishara et al. | |
| 2021/0082666 | A1* | 3/2021 | Zhao | H01J 37/32183 |
| 2021/0142986 | A1* | 5/2021 | Bhutta | H01L 21/67069 |
| 2022/0351942 | A1* | 11/2022 | Wang | H01J 37/32091 |

\* cited by examiner

400

402

Tuning a matcher to ignite plasma

404

Tuning the matcher to reduce reflected power

406

Setting a signal generator power and tuning the matcher to a delivered power setpoint

408

Recording the matcher and signal generator settings

500

502

Setting the matcher, setting the signal generator power, and activating output

504

Sweeping or stepping the signal generator frequency around a process frequency to find an ignition frequency

506

Sweeping or stepping the signal generator frequency to the process frequency

508

Validating the presence of plasma and recording ignition parameters

600

602 — Setting the matcher to a known position

604 — Turning on the signal generator

606 — Igniting plasma with a frequency sweeping or stepping

608 — Sweeping or stepping to the process frequency and regulating delivered power

700

702

Performing a pre-process setup

704

Performing a plasma-enhanced process step

706

Performing a non-plasma process step

Ignition Frequency Search
Pendulum Method

Ignition Frequency Search
Sweep Down Method

Ignition Frequency Search
Sweep Up Method

SYSTEMS AND METHODS FOR PLASMA PROCESS

TECHNICAL FIELD

The present invention relates generally to plasma processing systems and methods, and, in particular embodiments, to a systems and methods for setting and adjusting process parameters prior to and during plasma processing.

BACKGROUND

Generally, advancements in semiconductor integrated circuits (IC's) are driven by a demand for higher functionality at reduced cost. Higher functionality at lower cost is provided primarily by increasing component packing density through miniaturization. An IC is a network of electronic components (e.g., transistor, resistor, and capacitor) interconnected by a multilevel system of conductive lines, contacts, and vias. Elements of the network are integrated together by sequentially depositing and patterning layers of dielectric, conductive, and semiconductor materials over a semiconductor substrate using a fabrication flow comprising process steps such as chemical vapor deposition (CVD), photolithography, and etch. The packing density of circuit elements have been increased by periodically reducing minimum feature sizes with innovations such as immersion lithography and multiple patterning. Further miniaturization is achieved by reducing the device footprint with three-dimensional (3D) device structures (e.g., FinFET and stacked capacitor memory cell).

Plasma processes such as reactive ion etching (RIE), plasma-enhanced CVD (PECVD), plasma-enhanced atomic layer etch and deposition (PEALE and PEALD), and cyclic plasma process (e.g., cycles of alternating deposition and etch) are routinely used in the deposition and patterning steps used in semiconductor IC fabrication. The challenge of providing manufacturable plasma technology for advanced IC designs, however, has intensified with the advent of feature sizes scaled down to a few nanometers with structural features controlled at atomic scale dimensions. A manufacturable plasma process is expected to provide structures with precise dimensions (e.g., linewidths, etch depth, and film thicknesses) along with precisely controlled features for both plasma etch (e.g., sidewall angle, anisotropy, and selectivity to etch-stop layers) and plasma deposition (e.g., conformality, aspect-ratio selectivity, and area selectivity for bottom-up patterning), and uniformity across a wide (e.g., 300 mm) wafer. In many of the plasma processes used in IC manufacturing, the plasma is sustained by RF power. Fast and repeatable plasma ignition and power delivery are desirable for achieving precise control of plasma processes.

SUMMARY

In accordance with an embodiment, a method of performing a plasma process includes: generating, at an output of a signal generator, a first RF signal at a first frequency, the signal generator being coupled to a plasma chamber through a matching circuit; based on a feedback from the first RF signal, moving variable components of the matching circuit to fixed positions; generating, at the output of the signal generator, a second RF signal at a second frequency to ignite a plasma within the plasma chamber, and in response to detecting the plasma, switching the signal generator to output a third RF signal at the first frequency, the third RF signal sustaining the plasma, the plasma being configured to process a substrate loaded into the plasma chamber while holding the matching circuit at the fixed positions.

In accordance with another embodiment, a method of performing a plasma process includes: holding variable components of a matching circuit to fixed positions; determining an ignition frequency for igniting a plasma in a plasma chamber; generating, at an output of a signal generator, a first signal at the ignition frequency to ignite the plasma within the plasma chamber; and in response to detecting the plasma, switching the signal generator to output a second signal at a process frequency, the second signal sustaining the plasma while holding the variable components of the matching circuit to the fixed positions, the plasma being configured to process a substrate loaded into the plasma chamber.

In accordance with yet another embodiment, a method of performing a plasma process includes: powering a plasma chamber at a process frequency based on an output of a signal generator, the signal generator being coupled to the plasma chamber through a matching circuit; determining a delivered power from the signal generator to the plasma chamber; determining a configuration of the matching circuit based on the delivered power; determining, for the determined configuration of the matching circuit, an ignition frequency for igniting a plasma in the plasma chamber; igniting the plasma at the ignition frequency within the plasma chamber; and after the igniting, powering the plasma in the plasma chamber at the process frequency, the plasma being configured to process a substrate loaded into the plasma chamber.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Figure 1:
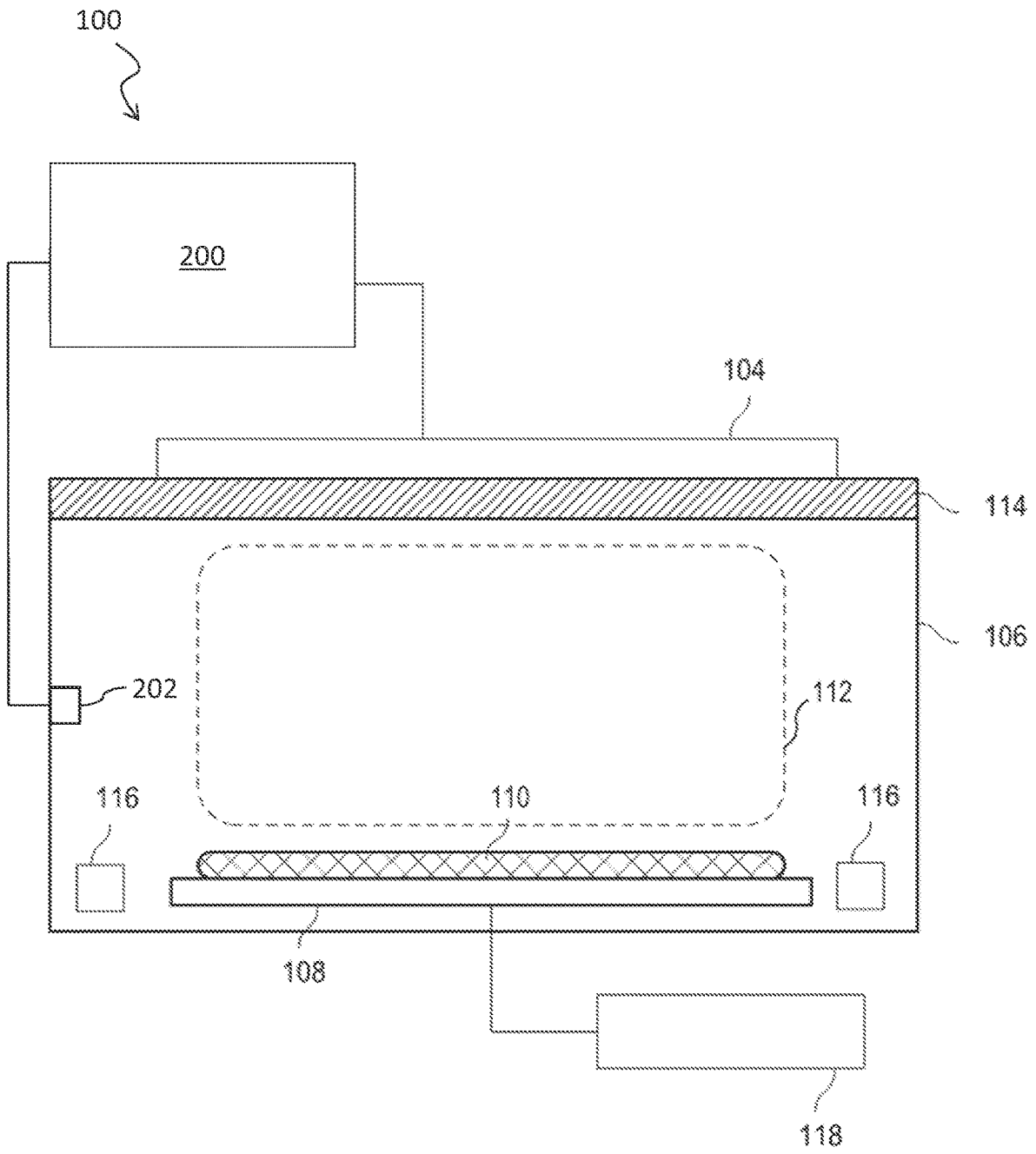
FIG. 1 is a diagram of a plasma processing system, in accordance with some embodiments.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE
EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments and should not be construed in a limited scope.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments. According to one or more embodiments of the present disclosure, this application relates to systems and methods for setting and adjusting process parameters prior to and during plasma processing.

While inventive aspects are described primarily in the context of resonating structures in a plasma processing system, the inventive aspects may be similarly applicable to fields outside the semiconductor industry. Plasma can be used to treat and modify surface properties through functional group addition. For example, to treat surfaces for paint deposit, plasma can convert hydrophobic surfaces to hydrophilic surfaces.

Embodiments disclosed herein may be useful for achieving fast and repeatable plasma ignition and power regulation for applications in plasma processes, such as RF plasma enhanced atomic layer deposition (PEALD) or plasma enhanced atomic layer etching (PEALE) applications. This may be useful for achieving reliable and controlled film growth or removal and improving repeatability of plasma processes on different wafers. However, the disclosed embodiments may be useful for applications in any plasma processes.

Various embodiments disclosed herein include two pre-process configuration methods and a plasma process method. The first pre-process includes automatically configuring settings for an impedance matching circuit and settings for the output frequency and power of the signal generator to provide improved power efficiency. The second pre-process includes a search for a frequency (also referred to as the ignition frequency) close to the process frequency at which plasma ignition may occur. The plasma process method uses the settings found by the first pre-process and the second pre-process to perform a plasma process with parameters set to ignite plasma at a desired process frequency and with a desired plasma power. This may be advantageous by increasing plasma process repeatability and decreasing plasma power variability and time spent tuning to the desired process frequency and plasma power during starts of the plasma process. The pre-process configuration methods and the plasma process method may be included into existing plasma process workflows (e.g., PEALD or PEALE workflows) to enhance process capabilities.

Embodiments of the disclosure are described in the context of the accompanying drawings. An embodiment of a plasma processing system will be described using FIG. 1. An embodiment of an RF source system will be described using FIG. 2. An embodiment of a matching circuit will be described using FIG. 3. An embodiment of a method for a first plasma pre-process will be described using FIGS. 4A and 4B. An embodiment of a method of a second plasma pre-process will be described using FIGS. 5A and 5B. An embodiment of a method for a plasma process will be described using FIGS. 6A and 6B. An embodiment of another method for a plasma process will be described using FIGS. 7A and 7B. Data taken during embodiment plasma processes will be described using FIGS. 8A, 8B, and 9. Embodiments of search methods for plasma ignition frequencies will be described using FIGS. 10A, 10B, and 10C.

FIG. 1 illustrates a diagram of a plasma processing system 100, in accordance with some embodiments. Plasma processing system 100 includes an RF source system 200, an electrode 104, a plasma chamber 106, and, optionally, a dielectric plate 114 (also referred to as a dielectric structure), which may (or may not) be arranged as shown in FIG. 1. In some embodiments, the dielectric structure includes air. Further, plasma processing system 100 may include additional components not depicted in FIG. 1.

The RF source system 200 (described in greater detail below with respect to FIG. 2) is coupled to the electrode 104. The RF source system 200 provides forward RF power to electrode 104. The forward RF power is transmitted (i.e., radiated) by the electrode 104 towards the plasma chamber 106. Although illustrated generically, the plasma in the plasma chamber 106 may be inductively or capacitively coupled to the electrode 104. Plasma chamber 106 includes a substrate holder 108. As shown, substrate 110 (e.g., a wafer) is placed on substrate holder 108 to be processed. Optionally, plasma chamber 106 may include a bias power supply 118 coupled to substrate holder 108. The plasma chamber 106 may also include one or more pump outlets 116 to remove by-products from plasma chamber 106 through selective control of gas flowrates within. In embodiments, pump outlets 116 are placed near (e.g., below/around the perimeter of) substrate holder 108 and substrate 110.

In embodiments, electrode 104 is separated from plasma chamber 106 by the dielectric plate 114, which is made of a dielectric material. Dielectric plate 114 separates the low-pressure environment within plasma chamber 106 from the external atmosphere. It should be appreciated that the electrode 104 can be placed directly adjacent to plasma chamber 106, or the electrode 104 can be separated from plasma chamber 106 by air. In embodiments, the dielectric plate 114 is selected to reduce reflections of the RF wave from the plasma chamber 106. In other embodiments, the electrode 104 is embedded within the dielectric plate 114.

In an embodiment, the electrode 104 couples RF power from RF source 102 to the plasma chamber 106 to treat the substrate 110. The radiated electromagnetic wave penetrates from the atmospheric side (i.e., the electrode 104 side) of the dielectric plate 114 into plasma chamber 106. The radiated electromagnetic wave generates an electromagnetic field within the plasma chamber 106. The generated electromagnetic field ignites and sustains plasma 112 by transferring energy to free electrons within the plasma chamber 106. The plasma 112 can be used to, for example, selectively etch or deposit material on substrate 110. A photodiode 202 in or coupled to the plasma chamber 106 provides feedback to the RF source system 200 on the ignition and energy of the plasma 112 by way of a current from the photodiode 202 that is proportional to the light amplitude of the plasma 112. In some embodiments, an optical emission spectrometer (OES) is used in place of or in addition to the photodiode 202 to give feedback on plasma ignition. The optical emission spectrometer may also provide spectral data on the plasma 112 to allow for tuning for specific plasma species.

In FIG. 1, the electrode 104 is shown to be external to plasma chamber 106. In embodiments, however, the electrode 104 can be placed internal to the plasma chamber 106.

Figure 2:
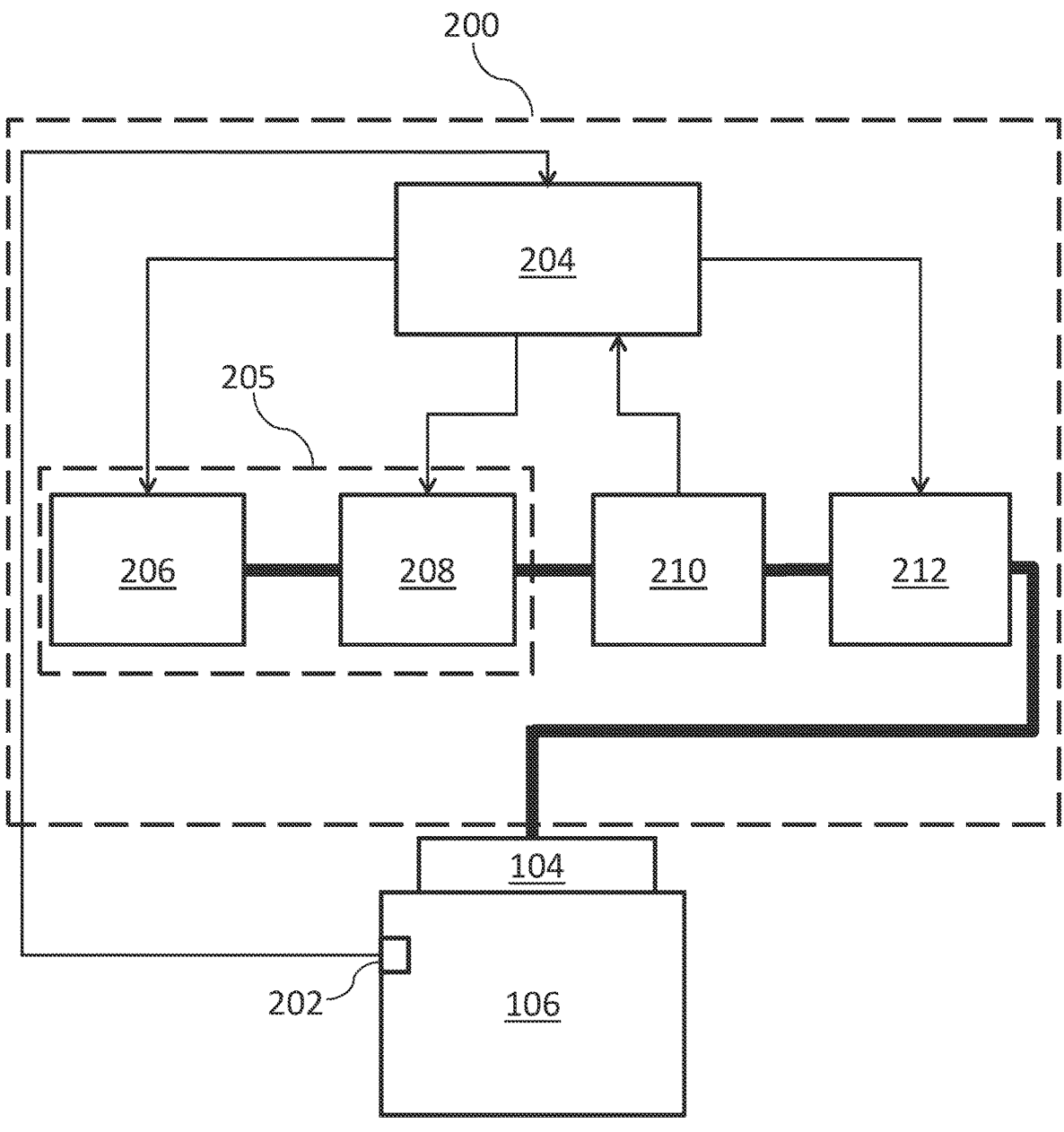
FIG. 2 is a diagram of an RF source system, in accordance with some embodiments.

FIG. 2 illustrates a diagram of the RF source system 200 with its couplings to the electrode 104, the plasma chamber 106, and the photodiode 202, in accordance with some embodiments. The RF source system 200 includes a controller 204, an RF generator 205, a VI probe 210, and a matching circuit 212 (also referred to as an impedance matching network; see below, FIG. 3). The RF generator 205 includes a signal generator 206 and an RF amplifier 208. In some embodiments, the signal generator 206 is coupled to the electrode 104 through the RF amplifier 208, the VI probe 210, and the matching circuit 212.

The controller 204 is used to automate the RF source system 200. The controller 204 is configured to provide instructions to the signal generator 206, the RF amplifier 208, and the matching circuit 212 and to receive feedback from the VI probe 210 and the photodiode 202. In some embodiments, the controller 204 includes a programmable processor, microprocessor, computer, or the like. Although the controller 204 is illustrated as a single element for illustrative purposes, the controller 204 may include multiple elements. The controller 204 may be programmable by instructions stored in software, firmware, hardware, or a combination thereof.

The signal generator 206 produces an RF waveform or signal supplied to the electrode 104. The signal generator 206 is configured to receive parameters from the controller 204 for producing desired powers and frequencies, such as for scanning over power and frequency ranges to find desired power and frequency settings for plasma ignition. The signal generator 206 may be a waveform (e.g., a sinusoidal waveform) generator, an analog signal generator, or the like. In some embodiments, the signal generator 206 has broadband capability, such as over a frequency range of 0.31 MHz to 250 MHz. However, any suitable signal generator 206 may be used, such as a signal generator without broadband capability.

The RF amplifier 208 provides power amplification of the RF signal supplied by the signal generator 206. The RF amplifier 208 is configured to be controlled by the controller 204, such as to receive instructions to turn on or off and to provide a desired factor of power amplification. In some embodiments, the RF amplifier 208 has broadband capability, such as over a frequency range of 0.08 MHz to 250 MHz. However, any suitable RF amplifier 208 may be used, such as an RF amplifier without broadband capability.

The VI probe 210 (also referred to as a voltage-current (V-I) sensor) is coupled on the radio-frequency (RF) signal pipe between the RF generator 205 and the matching circuit 212. The VI probe 210 provides feedback on power and impedance matching to the controller 204. The VI probe 210 may include a current sensor and a voltage sensor. In some embodiments, the VI probe 210 has broadband capability, such as over a frequency range of 0.307 MHz to 252 MHz. However, any suitable VI probe 210 may be used, such as a VI probe without broadband capability.

Figure 3:
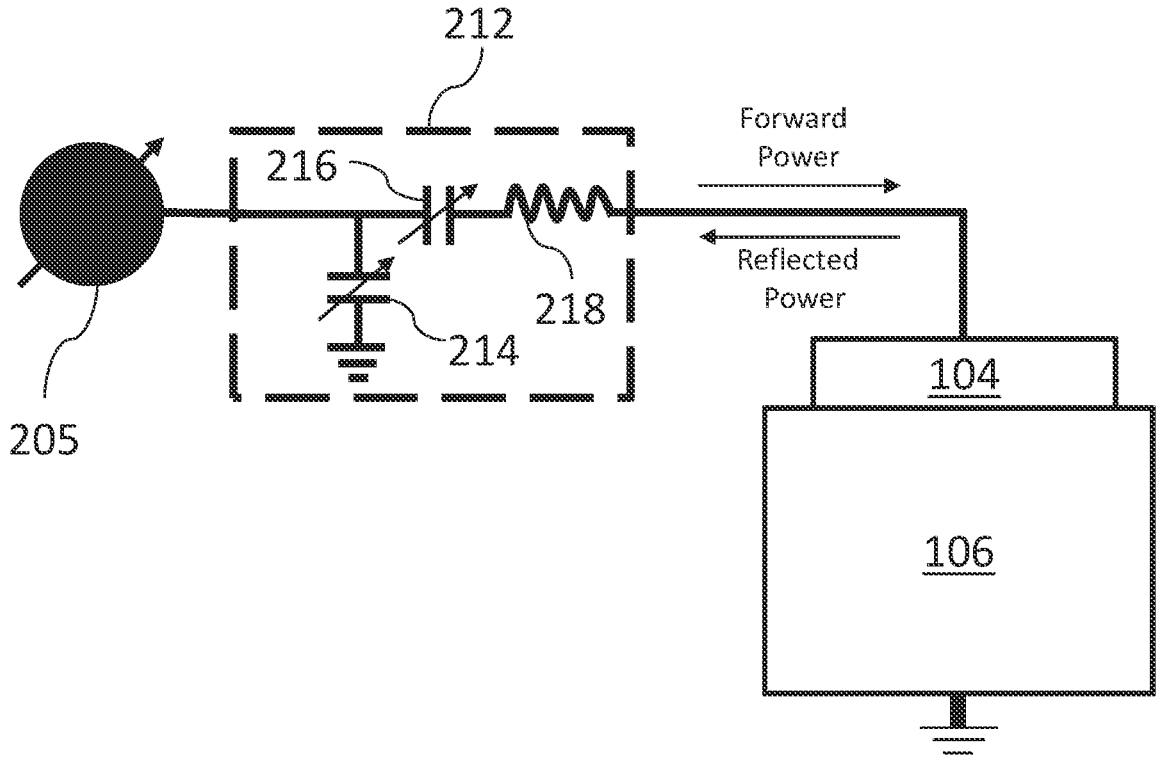
FIG. 3 is a diagram of a matching circuit, in accordance with some embodiments.

FIG. 3 illustrates a diagram of an example matching circuit 212, in accordance with some embodiments. The matching circuit 212 is coupled between the RF generator 205 and the electrode 104. As forward power propagates from the RF generator 205 to the electrode 104, some reflected power may be reflected back due to impedance mismatch between the plasma chamber 106 and the RF generator 205. The matching circuit 212 (also referred to as an impedance matching network) is used to reduce reflected power by transforming the impedance looking into the matching network, which is connected to the plasma chamber 106 to a same impedance as the RF generator 205, the transmission lines between the RF generator 205 and the electrode 104, and the VI probe 210 (not illustrated; see above, FIG. 2) coupled between the RF generator and the matching circuit 212. This increases the efficiency of supplying power to the plasma chamber 106.

The example matching circuit 212 includes a variable capacitor 214 coupled between the RF generator 205 and ground, a variable capacitor 216 coupled between a node between the RF generator 205 and the variable capacitor 214, and optionally an inductor 218 coupled between the variable capacitor 216 and the electrode 104. The inductor 218 may be included selectively to achieve matching impedances for certain frequency ranges in order to achieve broadband RF capabilities. The variable capacitor 214 and the variable capacitor 216 may include moving parts such as motors that control relative positions of, e.g., parallel plates of the variable capacitor 214 and the variable capacitor 216 in order to control their respective capacitances. The moving parts of the matching circuit 212 may receive instructions from the controller 204 (see above, FIG. 2).

It should be appreciated that the matching circuit 212 is illustrated in FIG. 3 as a non-limiting example of an impedance matching network. Any suitable matching circuit 212 including any suitable combination of impedance-adjustable variable components (e.g., variable or fixed capacitors, variable or fixed inductors, variable or fixed resistors, the like, or combinations thereof) is within the scope of the disclosed embodiments.

The matching circuit 212 may be tuned during a pre-process (see below, FIGS. 4A-4B) and kept at a configuration with a constant impedance during subsequent plasma processes. Although chamber impedance of the plasma chamber 106 may drift as plasma processes progress, moving parts of the matching circuit 212 may lead to lag when adjusting impedance. As such, it may be advantageous to tune the impedance of the matching circuit 212 during a pre-process step to reduce a need for subsequent adjustments and keep the impedance of the matching circuit constant during the plasma process. Frequency and power adjustments may be performed by the RF generator 205 during the plasma process to avoid lag from moving parts of the matching circuit 212 and enable a faster regulation system.

FIGS. 4A through 6B illustrate embodiment methods for a first pre-process, a second pre-process, and a subsequent plasma process. The first pre-process, illustrated in FIGS. 4A and 4B, includes configuring settings for the matching circuit 212 and settings for the output power of the RF generator 205 to increase power efficiency. The second pre-process, illustrated in FIGS. 5A and B, includes a search for an ignition frequency close to a desired process frequency. The plasma process, illustrated in FIGS. 6A and 6B, ignites plasma at a desired process frequency and with a desired plasma power using the settings found by the first pre-process and the second pre-process.

Figure 4A:
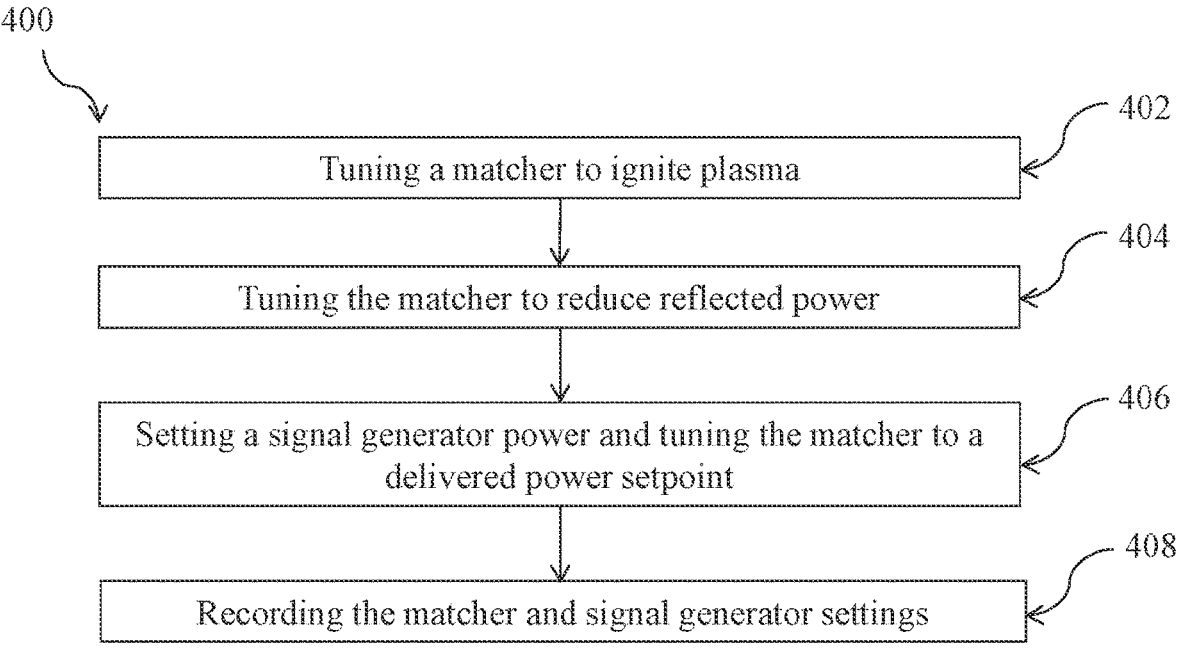
FIG. 4A is a flow chart of a method for a first plasma pre-process, in accordance with some embodiments.
Figure 4B:
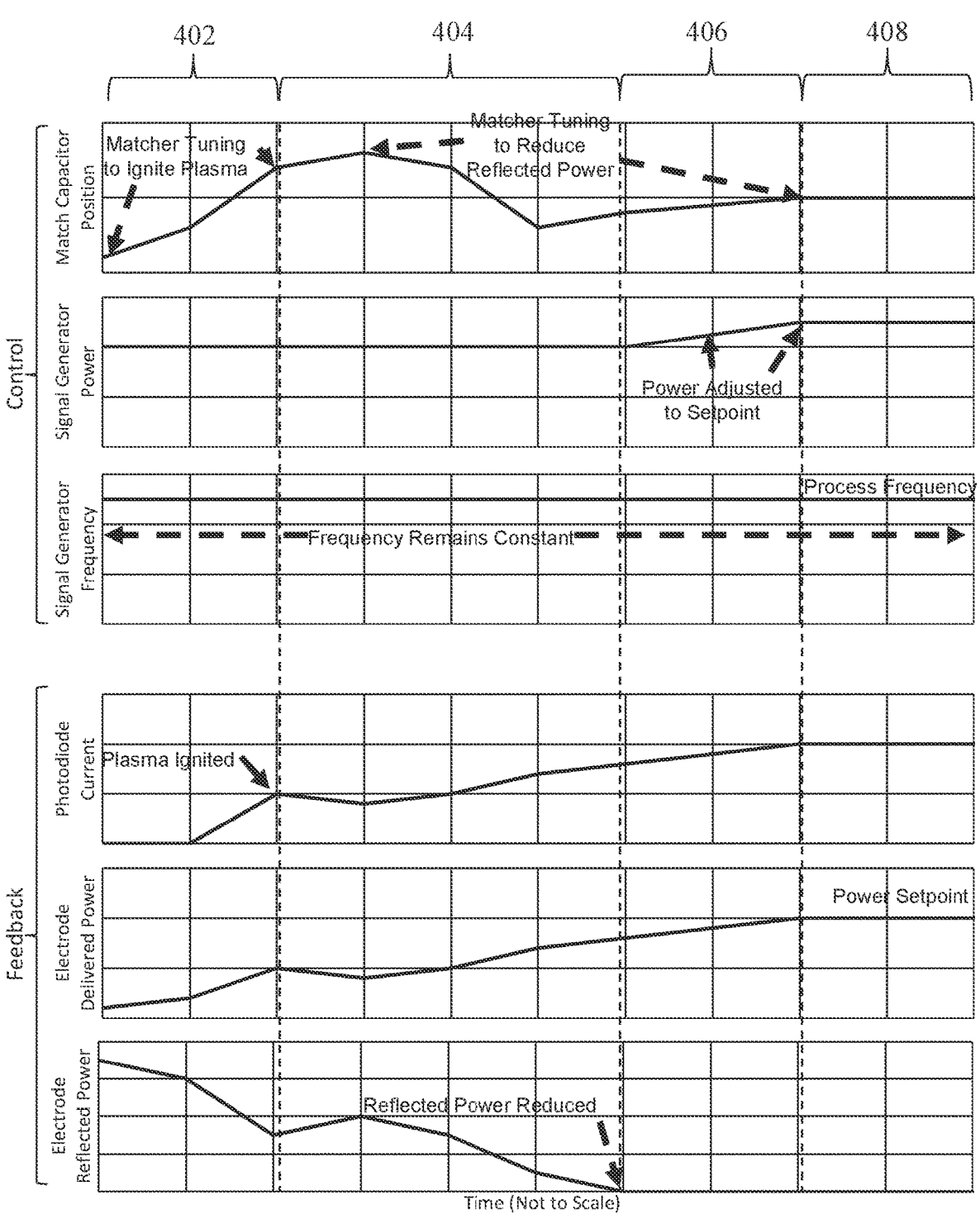
FIG. 4B illustrates graphs of positions, powers, frequencies, and currents during the method illustrated by FIG. 4A, in accordance with some embodiments.

FIG. 4A illustrates a flow chart of an embodiment method 400 for a first pre-process, and FIG. 4B illustrates graphs of positions, powers, frequencies, and currents during the method 400, in accordance with some embodiments. FIG. 4B includes six graphs of quantities plotted against time (not to scale). The control graphs show quantities used by the controller 204 to control the signal generator 206 and the matching circuit 212: match capacitor position of the matching circuit 212, signal generator power of the signal generator 206, and signal generator frequency of the signal generator 206. The feedback graphs show quantities received by the controller 204 indicating performance of the RF source system 200: photodiode current from the photodiode 202, electrode delivered power from the VI probe 210, and electrode reflected power from the VI probe 210.

In the method 400 for the first pre-process, the controller 204 automatically configures the settings for the output power for the signal generator 206 and configures the matching circuit 212 settings to provide increased power efficiency. The first pre-process is performed during the setup of a process recipe used in the plasma chamber 106 prior to processing a wafer. The plasma chamber 106 is setup for the process recipe by setting the process gas flow rates and the chamber pressure. The desired RF frequency and plasma power used for the subsequent plasma process (see below, FIGS. 6A-6B) are already known as part of the process recipe.

In step 402, the matching circuit 212 is tuned to ignite plasma in the plasma chamber 106. The controller 204 turns on the output of the signal generator at the desired frequency (e.g., the process frequency for the subsequent plasma process; see below, FIGS. 6A-6B) and power. The matching circuit 212 is tuned in order to ignite the plasma, as illustrated by the match capacitor position being adjusted in FIG. 4B. When plasma ignition occurs, the photodiode 202 detects light from the plasma and provides feedback to the controller 204 as a current from the photodiode 202. In some embodiments, the time scale of step 402 from its to beginning to plasma ignition is in a range of less than a second to ten seconds, depending on starting positions of moving parts of the matching circuit 212 (e.g., variable capacitors).

In step 404, the controller 204 further tunes the matching circuit 212 to increase power efficiency by increasing delivered power to the electrode 104 and reducing reflected power from the electrode 104. Feedback of the delivered power to the electrode 104 and reflected power from the electrode 104 is provided to the controller 204 by the VI probe 210. In some embodiments, the time scale of step 404 from its to beginning to plasma ignition is in a range of less than a second to ten seconds, depending on positions of moving parts of the matching circuit 212 (e.g., variable capacitors).

In step 406, the controller 204 adjusts the output power of the signal generator 206 to achieve the desired setpoint for the plasma power (e.g., the plasma power to be used for the subsequent plasma process). The controller 204 further tunes the matching circuit 212 to maintain power efficiency at the same time using feedback of the delivered power to the electrode 104 and reflected power from the electrode 104 from the VI probe 210.

In step 408, the controller 204 records the settings of the matching circuit 212 (e.g., positions of variable components of the matching circuit 212) and the signal generator 206. The power from the signal generator 206 may be turned off after step 408 is complete. The recorded configurations of the matching circuit 212 and the signal generator 206 may be used in the following second pre-process (see below, FIGS. 5A-5B) and the following plasma process (see below, FIGS. 6A-6B). In some embodiments, the method 400 is performed once for each process recipe, and the recorded settings may be used for any following plasma process performed with that process recipe using the same equipment (e.g., the RF source system 200 and the plasma chamber 106) in order to save process time and increase throughput.

Figure 5A:
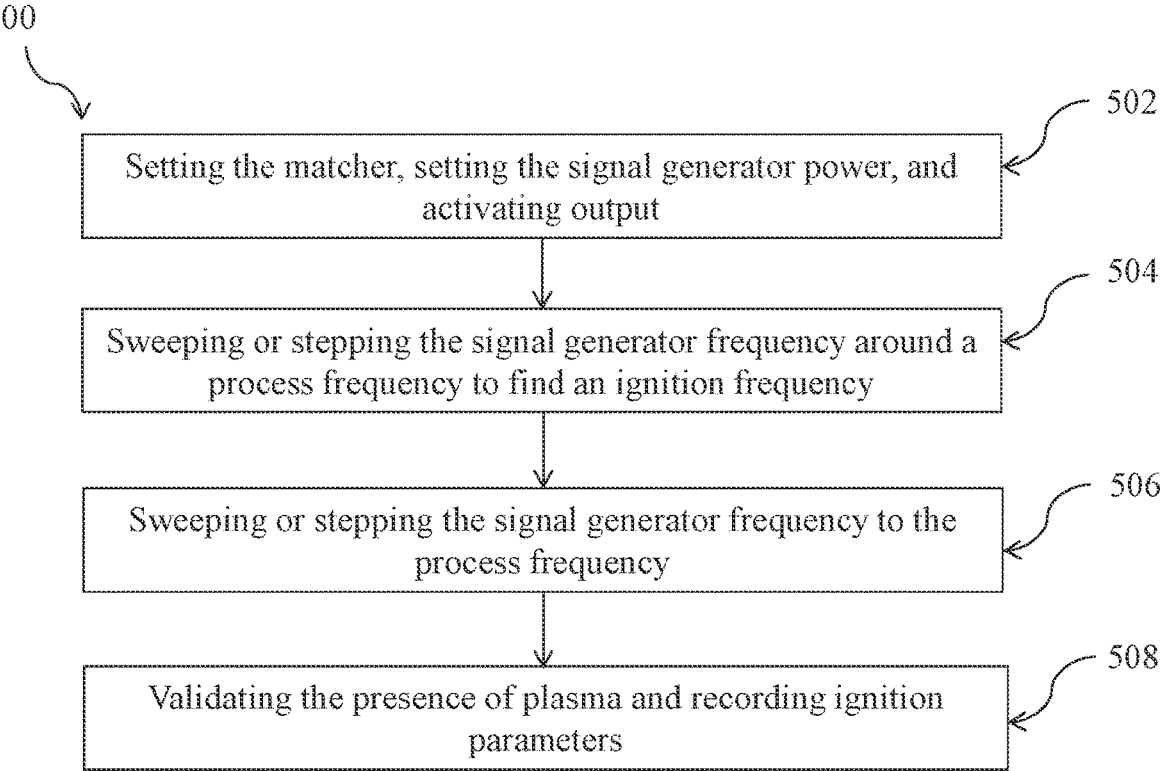
FIG. 5A is a flow chart of a method for a second plasma pre-process, in accordance with some embodiments.
Figure 5B:
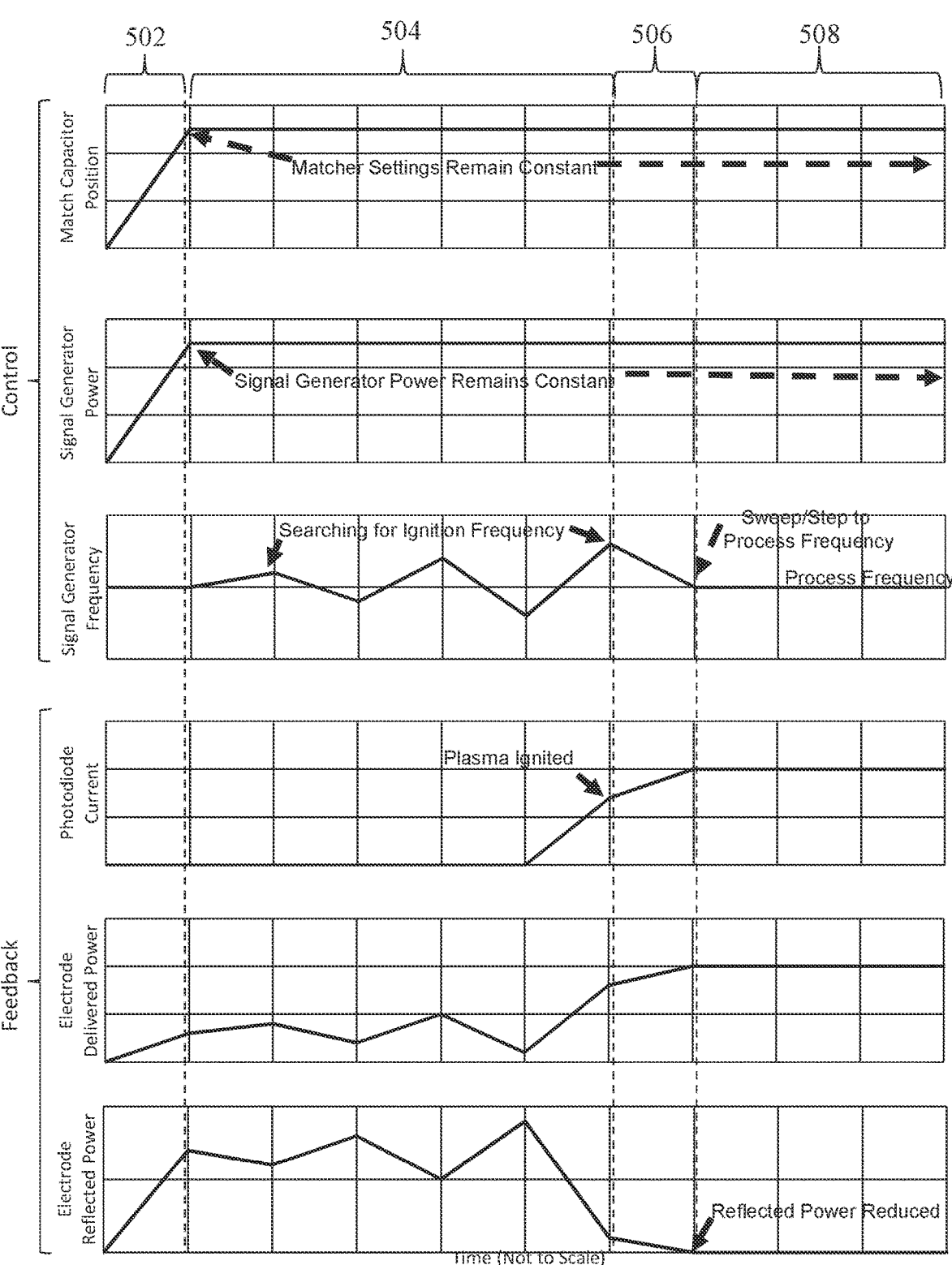
FIG. 5B illustrates graphs of positions, powers, frequencies, and currents during the method illustrated by FIG. 5A, in accordance with some embodiments.

FIG. 5A illustrates a flow chart of an embodiment method 500 for a second pre-process, and FIG. 5B illustrates graphs of positions, powers, frequencies, and currents during the method 500, in accordance with some embodiments. The format of the graphs of FIG. 5B is similar to the format of the graphs of FIG. 4B, and the details are not repeated herein.

The second pre-process may be performed immediately after the first pre-process (see above, FIGS. 4A-4B). In the method 500 for the second pre-process, the controller 204 uses the signal generator 206 to search for an ignition frequency of the plasma. The ignition frequency is a frequency sufficiently close to the desired process frequency at which plasma ignition may occur. The search pattern may be a frequency sweep, a frequency stepping, or the like. For example, In step 502, the controller 204 sets variable components of the matching circuit 212 to pre-determined fixed positions, such as to the settings recorded in step 408 of the method 400 (see above, FIGS. 4A-4B). The controller 204 then turns on the signal generator 206, sets its frequency to the desired process frequency, and increases the output power of the signal generator 206 to the recorded setpoint. The settings of the matching circuit 212 and the output power of the signal generator 206 may then be held constant for the remainder of the method 500.

In step 504, the controller 204 incrementally sweeps or steps the output frequency of the signal generator 206 up and down around the desired process frequency to find an ignition frequency. The resolution of the frequency search (e.g., a sweep or step) may be provided to the controller 204 by a user. When plasma ignition occurs, ignition feedback is provided to the controller 204 by an increase in the photodiode current from the photodiode 202. The pendulum-style search method illustrated in FIG. 5B may also be replaced with a sweep up or sweep down search method (see below, FIGS. 10B-10C), or any other suitable search method. In some embodiments, the time scale of step 504 is less than a second. Sweeping or stepping the output frequency of the signal generator 206 may allow the time between plasma ignition and subsequent regulation to the power setpoint to be reduced as no mechanical motion (e.g., of capacitor components of the matching circuit 212) is performed.

In step 506, the controller 204 sweeps or steps the frequency of the signal generator 206 to the desired process frequency. Reflected power from the electrode 104 may be reduced by setting the output frequency of the signal generator 206 to the desired process frequency, as the settings of the matching circuit 212 were set in step 502 to reduce the reflected power at the desired process frequency.

In step 508, the controller 204 validates the continued presence of plasma in the plasma chamber 106 and records the parameters of the ignition frequency and the subsequent sweep or step to the desired process frequency. The controller 204 uses feedback from the photodiode 202 to verify that plasma is still present in the plasma chamber 106. If plasma is no longer present, then the controller 204 returns to step 506 and continues to sweep or step from the ignition frequency back to the process frequency at slower rates until reliable ignition occurs.

When the presence of plasma is validated, the controller 204 records the ignition sweep parameters such as the ignition frequency, the search mode used (e.g., a frequency sweep, step, or the like), and the rate of the frequency sweep or step. The recorded ignition sweep or step parameters may be used in the following plasma process. In some embodiments, the method 500 is performed once for each process recipe, and the recorded settings may be used for any following plasma process performed with that process recipe using the same equipment (e.g., the RF source system 200 and the plasma chamber 106) in order to save process time and increase throughput.

The controller 204 may also be configured to ignite plasma with two additional methods. In one method, the controller 204 starts the frequency of the signal generator 206 at the process frequency in step 504. The controller 204 then sweeps or steps the frequency to the ignition frequency and then sweeps or steps the frequency back to the process frequency. In another method, the controller 204 starts the frequency of the signal generator 206 at the ignition frequency and then sweeps or steps the frequency to the process frequency. If plasma did not remain present during the automated ignition frequency search, the controller 204 may continue sweeping or stepping from the ignition frequency to the process frequency at slower rates until reliable ignition occurs. In some combinations of plasma chamber settings, process recipes, and desired process frequencies, plasma may ignite without the need for a frequency sweep or stepping (e.g., when the desired process frequency is an ignition frequency). In these cases, frequency sweeping or stepping can be omitted.

Figure 6A:
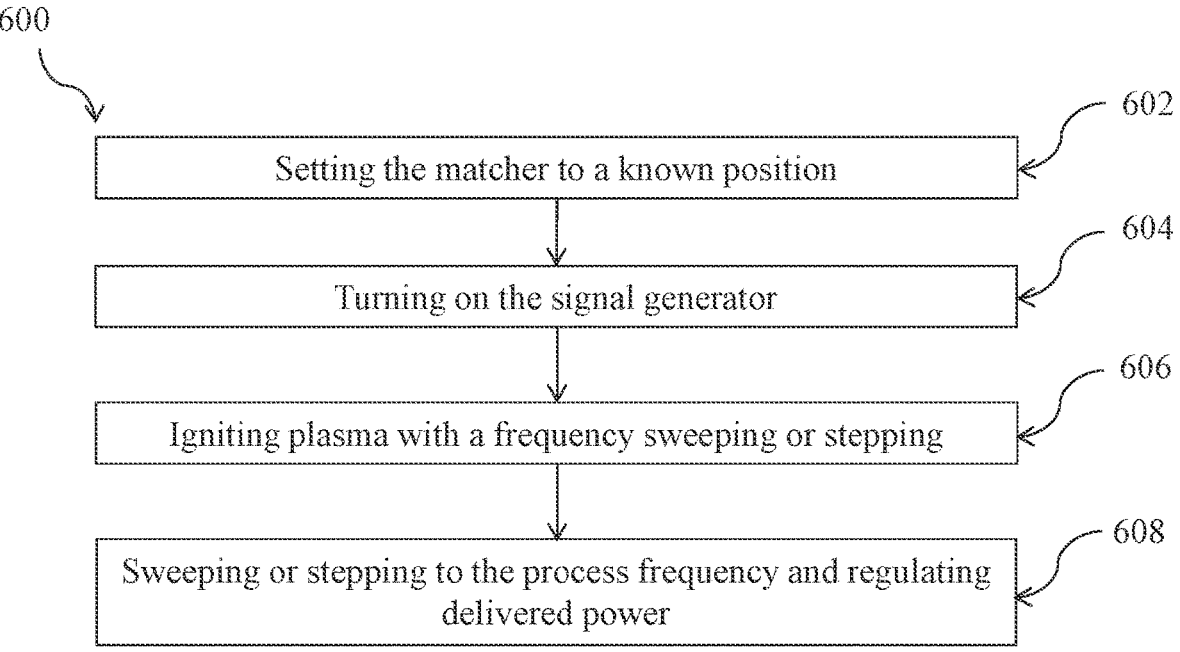
FIG. 6A is a flow chart of a method for a plasma process, in accordance with some embodiments.
Figure 6B:
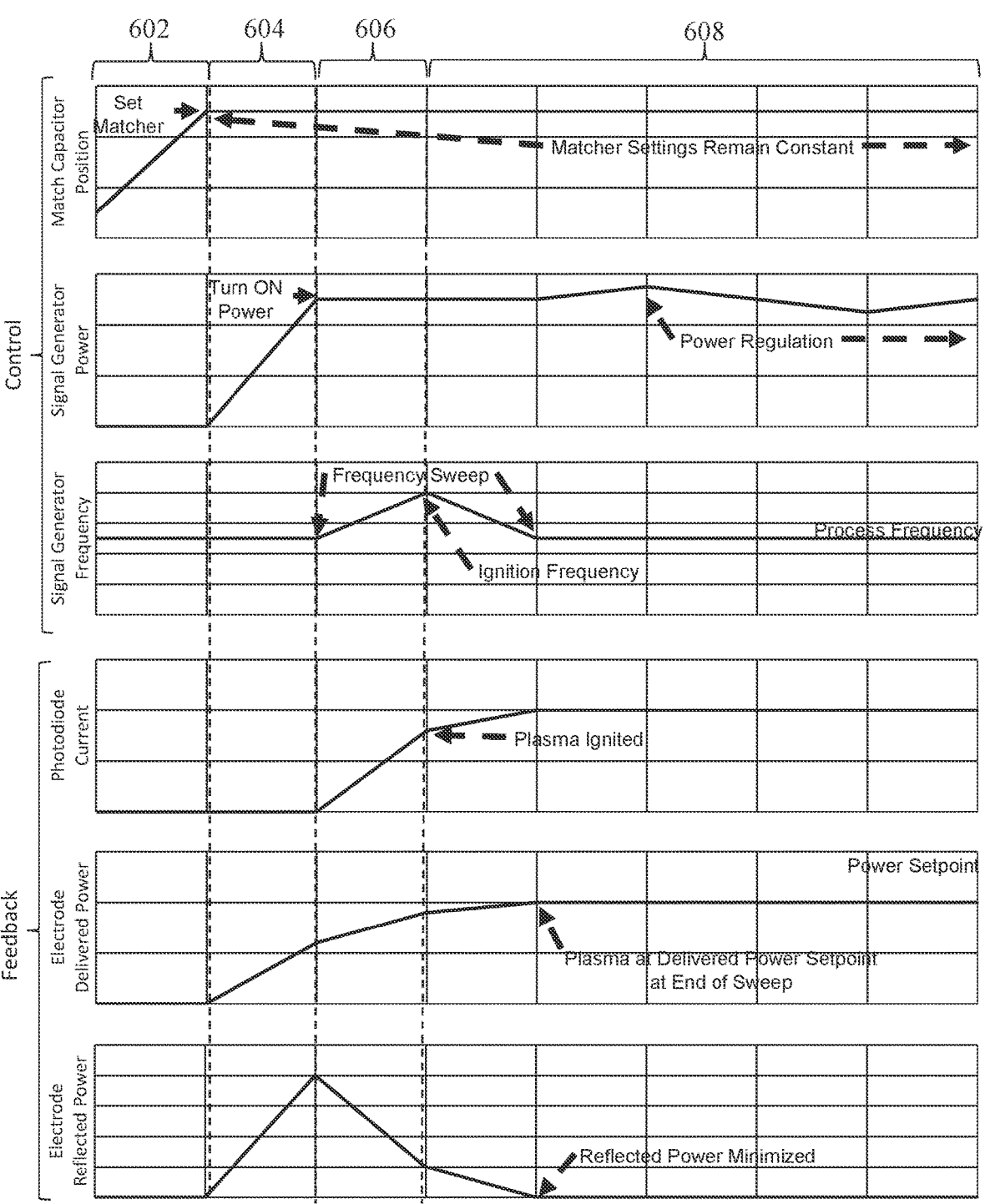
FIG. 6B illustrates graphs of positions, powers, frequencies, and currents during the method illustrated by FIG. 6A, in accordance with some embodiments.

FIG. 6A illustrates a flow chart of an embodiment method 600 for a plasma process, and FIG. 6B illustrates graphs of positions, powers, frequencies, and currents during the method 600, in accordance with some embodiments. The format of the graphs of FIG. 6B is similar to the format of the graphs of FIG. 4B, and the details are not repeated herein.

The first pre-process (see above, FIGS. 4A-4B) and the second pre-process (see above, FIGS. 5A-5B) find the parameters to ignite plasma at the desired process frequency and with a plasma power within a desired range of the power setpoint (e.g., within 1% of the power setpoint). A wafer or the like is loaded into the plasma chamber 106 for processing and the settings of the matching circuit 212 remain constant during the subsequent plasma process of method 600, which may be a PEALD, PEALE, or other plasma process.

In some embodiments, the plasma process is performed immediately after the second pre-process (see above, FIGS.

5A-5B). However, if the first and second pre-processes have been previously performed for the process recipe of the plasma process, then the plasma process may be performed immediately using the recorded settings for the matching circuit 212 and the signal generator 206 in the controller without re-running the first and second pre-processes. In other words, after running the first pre-process and the second pre-process for calibration of the RF source system 200 for a plasma process with a particular process recipe, the recorded settings may be used for multiple runs of the plasma process without repeating the first and second pre-processes.

In step 602, the controller 204 sets variable components of the matching circuit 212 to known fixed positions (e.g., recorded positions found in the first pre-process; see above, FIGS. 4A-4B) prior to activating the signal generator 206. The controller 204 then maintains the settings of the matching circuit 212 through the rest of the plasma process.

In step 604, the controller 204 turns on the signal generator 206. The output power of the signal generator 206 is increased to the desired power setpoint and the frequency of the signal generator is set to the desired process frequency.

In step 606, the controller 204 begins a frequency sweep or stepping of the output frequency of the signal generator 206 to the recorded ignition frequency in order to ignite plasma. The photodiode 202 provides feedback indicating successful plasma ignition in the plasma chamber 106. Ignition of the plasma may occur within 1% of the desired plasma power setpoint. Step 606 may occur on a time scale in milliseconds, such as in a range of 1 millisecond to 10 milliseconds. In other embodiments, the controller 204 begins the output of the signal generator at the recorded ignition frequency in step 604 and step 606 is skipped. In still other embodiments, the second pre-process is omitted and a full search for an ignition frequency is performed in step 606.

In step 608, the controller 204 sweeps or steps the output frequency of the signal generator 206 from the ignition frequency to the desired process frequency. The controller 204 adjusts the output power of the signal generator 206 to maintain the plasma power setpoint. The controller 204 compensates for any drift using feedback from the VI probe 210 to maintain a constant delivered power to the electrode 104. In some embodiments, maintaining a constant delivered power to the electrode 104 reduces the reflected power from the electrode 104. In some embodiments, the controller 204 also performs frequency tuning by adjusting the signal generator output frequency around the process frequency to reduce reflected power and maintain a low reflected power from the electrode 104. The controller 204 continues to regulate the output power of the signal generator 206 until the end of the plasma process, when the power is turned off. The settings of the matching circuit 212 remain constant throughout the process, which allows high efficiency to be maintained.

Figure 7A:
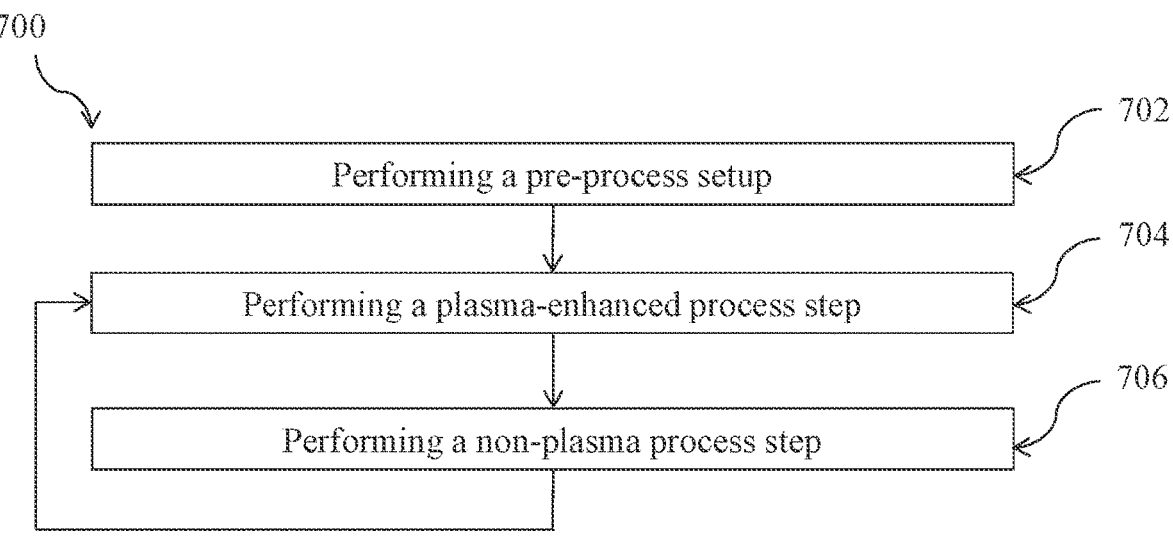
FIG. 7A is a flow chart of a method for a plasma process, in accordance with some embodiments.
Figure 7B:
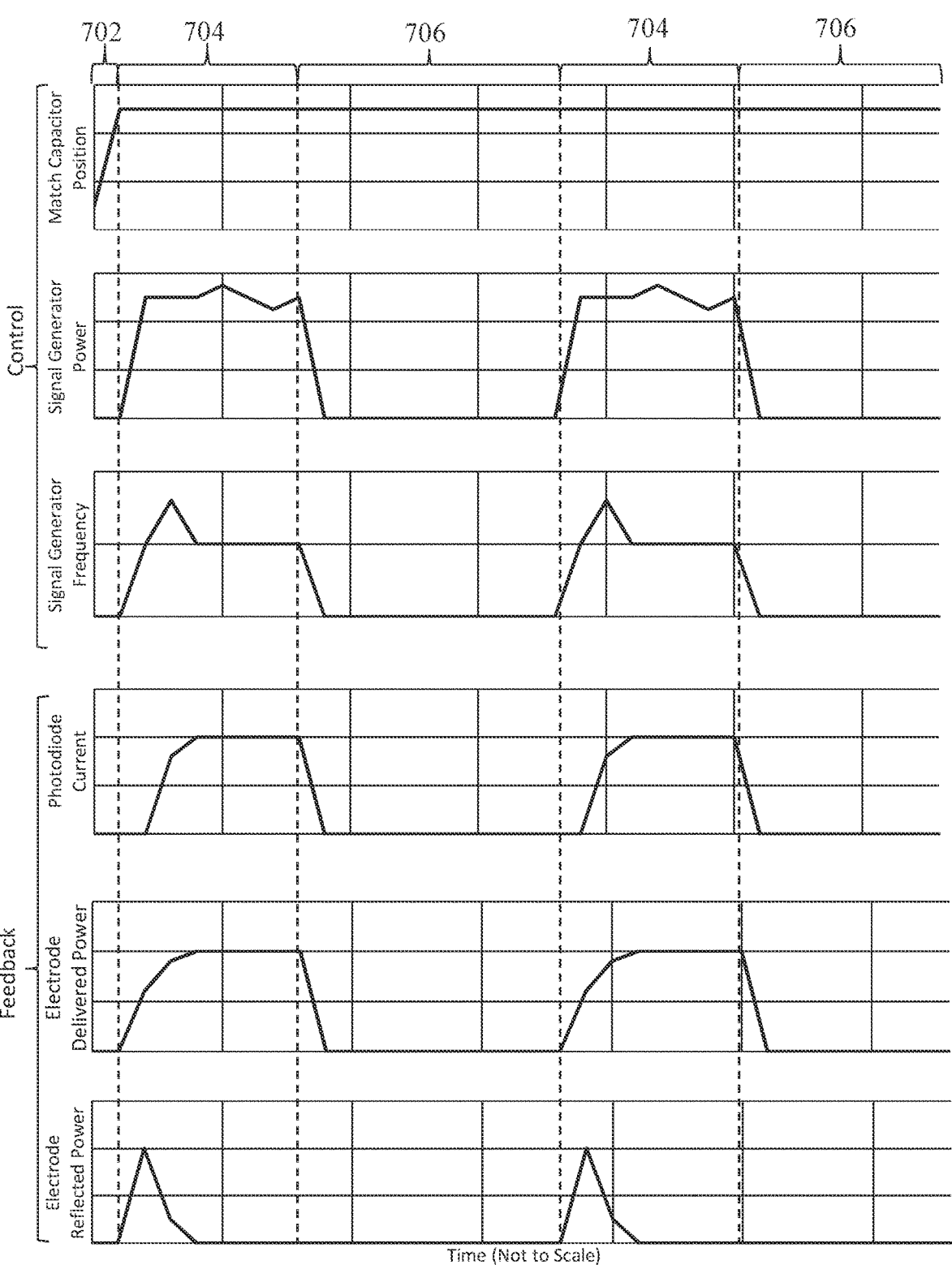
FIG. 7B illustrates graphs of positions, powers, frequencies, and currents during the method illustrated by FIG. 7A, in accordance with some embodiments.

FIG. 7A illustrates a flow chart of an embodiment method 700 for a plasma-enhanced process for which recorded settings have already been found (e.g., as described above with respect to FIGS. 4A-5B), and FIG. 7B illustrates graphs of positions, powers, frequencies, and currents during the method 600, in accordance with some embodiments. The format of the graphs of FIG. 7B is similar to the format of the graphs of FIG. 4B, and the details are not repeated herein. The plasma-enhanced process illustrated by FIGS. 7A and 7B may be a PEALD, PEALE, or any other suitable process using plasma.

In step 702, a pre-process setup is performed by the controller 204 in preparation to begin the plasma process. For example, the controller 204 may set moveable parts of the matching circuit 212 (e.g., capacitor positions) in order to reduce reflected power from the electrode 104 at the desired process frequency and power setpoint.

In step 704, a plasma-enhanced process step is performed by the controller 204. The plasma-enhanced process step may be performed similar to steps 604 through 608 as described above with respect to FIGS. 6A-6B. For example, the power of the signal generator 206 is turned on and the output frequency is swept or stepped from the desired process frequency to the ignition frequency. Once plasma is detected by feedback from the photodiode 202, the output frequency is swept or stepped back to the process frequency. The controller 204 continues to regulate the output power of the signal generator 206 in order to maintain a constant delivered power to the electrode 104 until the end of the plasma-enhanced process step. The settings of the matching circuit 212 remain constant through step 704.

In step 706, a non-plasma-enhanced process step is performed by the controller 204. The controller 204 turns off the power output of the signal generator 206 to end plasma generation. A suitable non-plasma-enhanced process step is then performed, such as a purge of the plasma chamber 106, a flow of a precursor without plasma, a dry or wet etching step, or the like. In some embodiments, another plasma-enhanced process step is performed instead of a non-plasma-enhanced process step. The settings of the matching circuit 212 remain constant through step 706. Subsequently, the controller 204 may iterate steps 704 and 706 until the plasma-enhanced process is complete.

Figure 8A:
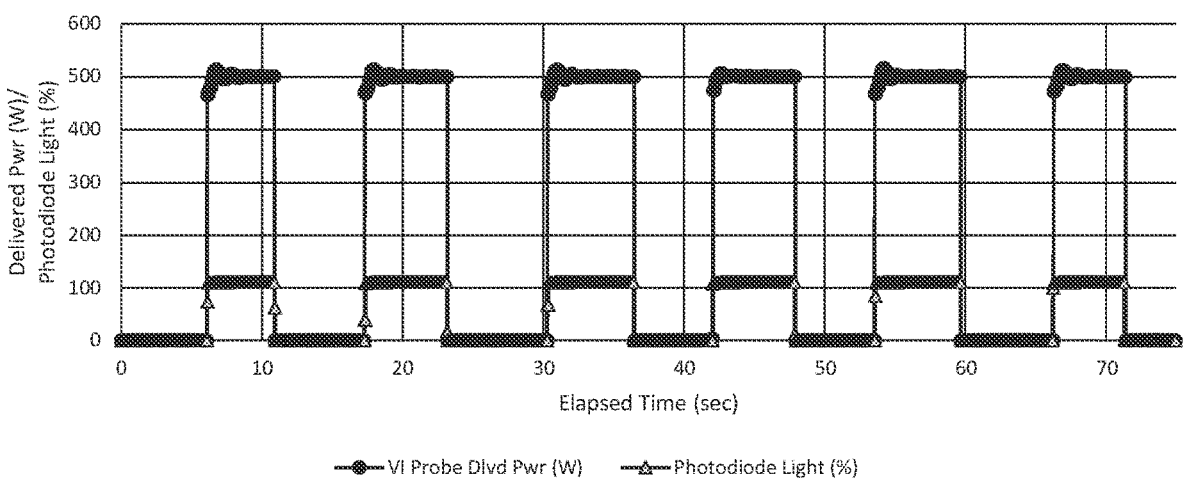
FIGS. 8A and 8B illustrate graphs of data taken during a plasma process, in accordance with some embodiments.
Figure 8B:
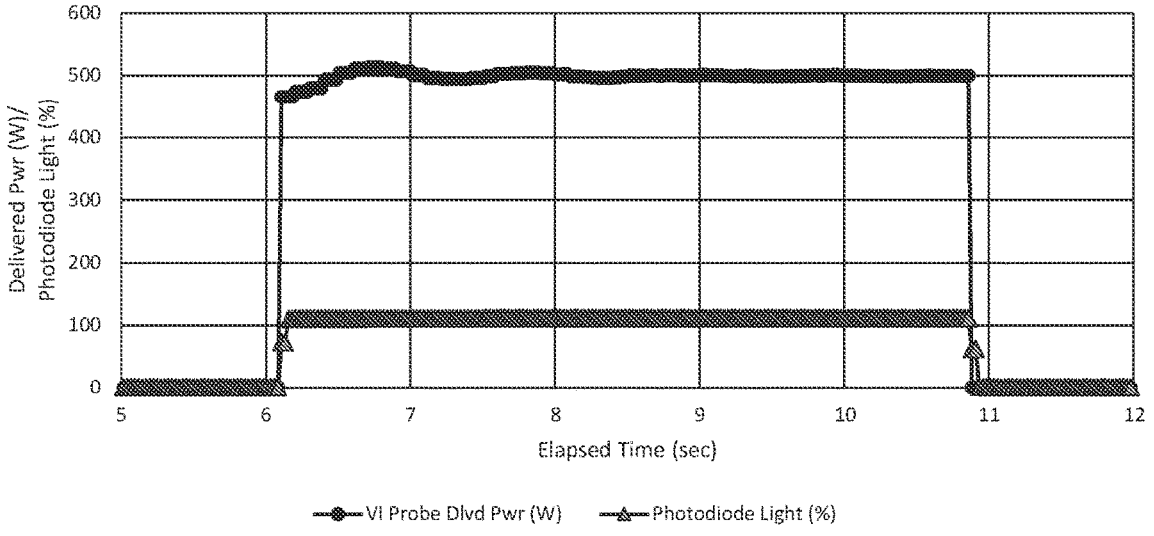
Figure 9:
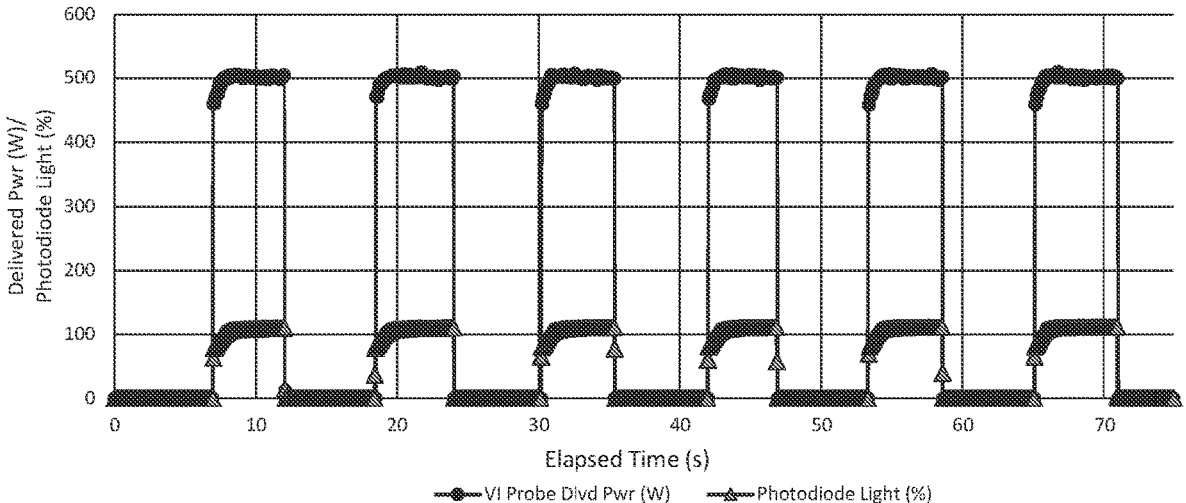
FIG. 9 illustrates a graph of data taken during a plasma process, in accordance with some embodiments.

FIGS. 8A, 8B, and 9 illustrate data taken during embodiment plasma processes where plasma is ignited and regulated to the power setpoint over several cycles. The graphs illustrated by FIGS. 8A, 8B, and 9 plot delivered power in watts as measured by a VI probe 210 (see above, FIG. 2) and percentage of light versus elapsed time measured in seconds during embodiment plasma processes. The percentage of light is the measured voltage from the output of the amplifier of the photodiode 202 versus the expected maximum output voltage deliverable from the amplifier of the photodiode 202 (such as according to the datasheet for the amplifier).

FIGS. 8A and 8B illustrate delivered power and photodiode light versus elapsed time for an embodiment plasma process with a desired process frequency of 40 MHz, a power setpoint of 500 W, an ignition frequency of 60 MHz that achieves plasma ignition at 2 milliseconds, and is performed with a chamber pressure of 300 mTorr with a gas volume ratio of nitrogen ($N_2$) to Ar of 1:10, such as with a flow rate of 100 SCCM of $N_2$ and 1000 SCCM of Ar. FIG. 8A shows the process over about 75 seconds, and FIG. 8B shows a narrower time window of FIG. 8A from 5 seconds to 12 seconds. As shown in FIGS. 8A and 8B, the delivered power is raised to close to the desired power setpoint of 500 W and then tuned to 500 W over each active plasma process step (e.g., from about 6 seconds to about 11 seconds). The percentage of photodiode light quickly increases to 100% and stays constant at that level for each active plasma process step, indicating the continued presence of ignited plasma. At the end of each active process step, the delivered power and photodiode light drop to zero.

FIG. 9 illustrates delivered power and photodiode light versus elapsed time for an embodiment plasma process with a desired process frequency of 200 MHz, a power setpoint of 500 W, an ignition frequency of 201 MHz that achieves plasma ignition at 2 milliseconds, and is performed with a chamber pressure of 300 mTorr with a gas volume ratio of nitrogen ($N_2$) to Ar of 1:10, such as with a flow rate of 100 SCCM of $N_2$ and 1000 SCCM of Ar. As illustrated for the embodiment plasma process of FIG. 9, the delivered power and photodiode light take longer amounts of time to reach the desired power setpoint and a fully ignited plasma state, respectively, than for the embodiment plasma process illustrated in FIGS. 8A-8B.

Figure 10A:
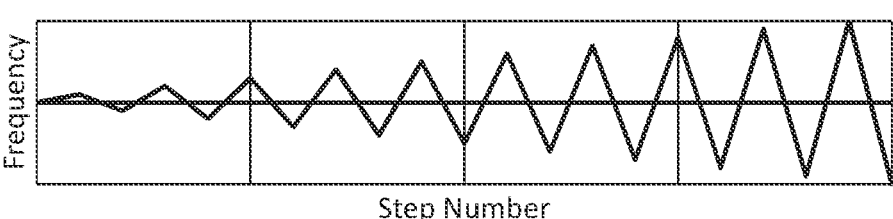
FIGS. 10A, 10B, and 10C illustrate graphs of search methods for plasma ignition frequencies, in accordance with some embodiments.
Figure 10B:
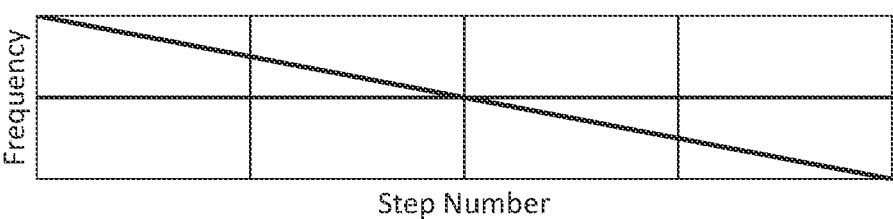
Figure 10C:
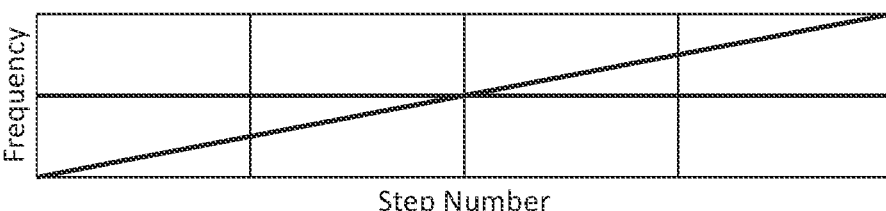

FIGS. 10A, 10B, and 10C illustrate graphs of search methods for plasma ignition frequencies, in accordance with some embodiments. FIG. 10A illustrates a pendulum search method in which the output frequency of the signal generator 206 is swept up and down around a starting frequency by increasing margins from the starting frequency until plasma ignition is detected. FIG. 10B illustrates a sweep down method in which the output frequency of the signal generator 206 is decreased from a starting frequency until plasma ignition is detected. FIG. 10C illustrates a sweep up method in which the output frequency of the signal generator 206 is decreased from a starting frequency until plasma ignition is detected. Any of the example search methods illustrated may be used in the second pre-process method 500, step 504 (see above, FIGS. 5A-5B). Other search methods that may be used include stepping methods in which the output frequency is changed in discrete steps rather than in a continuous sweep, bisection methods that continually bisects a frequency interval until an ignition frequency closest to the desired process frequency is found, or the like.

In some embodiments, the controller 204 is configured to use data on ignition frequencies, sweeping or stepping from a process frequency to an ignition frequency and the reverse, or impedance matching network settings that were recorded in setup for and during previous plasma processes. For example, the controller 204 may be configured to use a machine learning model that includes a database of recordings made during previous plasma processes (such as experimental plasma runs, production plasma processes, the like, or a combination thereof). The machine learning model uses the saved accumulated data to perform searches for ignition frequencies or impedance matching network settings more efficiently. The machine learning model may also find more efficient methods of switching between desired process frequencies and ignition frequencies during the starts of actual plasma process steps.

The machine learning model may use a database of recorded plasma chamber parameters from previous plasma processes such as gas composition (e.g., species of gas present), gas ratio (e.g., volume ratios of gas species present), flow rates, chamber pressure, chamber temperature, plasma power setpoint, plasma frequency, or the like. The database allows the machine learning model to make improved predictions, such as for more efficient matcher capacitor positions, signal generator output power to achieve the desired delivered RF power, and ignition frequency to ignite plasma. The machine learning model uses the recorded plasma chamber parameters along with the matching circuit parameters, signal generator output power, and ignition parameters to identify trends in how the ideal settings correlate with changes to the chamber parameters. For some plasma process recipes the matching circuit capacitor positions and signal generator output power may be only slightly changed when changing the chamber pressure and other parameters (e.g., ignition parameters) may be left the same. For example, a capacitor in the matching circuit may benefit from a decrease in capacitance and the signal generator output power may benefit from a slight increase in order to maintain delivered power and achieve plasma ignition efficiently when the chamber pressure is increased. The machine learning model may identify trends such as or similar to the above example to make predictions for a new process chamber recipe. These predictions from the machine learning module may lead to faster and more efficient pre-process steps (e.g., the first pre-process of method 400 and the second pre-process of method 500; see above, FIGS. 4A-5B).

In some embodiments, a sufficiently advanced machine learning model with a sufficiently large database of previous plasma processes may allow for accurate predictions of ideal RF parameters from the chamber conditions of a new plasma process recipe. With these accurate predictions, the pre-process steps (e.g., the first pre-process of method 400 and the second pre-process of method 500; see above, FIGS. 4A-5B) can be omitted. The machine learning model may be generated to be specific to a particular plasma chamber. As such, the machine learning model would compensate for slight modifications to flow rates, chamber pressure, chamber temperature, or the like since gas chemistry is not usually completely changed for process chambers. As such, the machine learning model may be advantageous for similar plasma process recipes performed in the same plasma chamber, although machine learning models may also be applied to other plasma process recipes performed in other chambers.

The RF source system 200 and methods 400, 500, 600, and 700 as described above with respect to FIGS. 2-7B may allow increased plasma process repeatability (e.g., PEALD, PEALE, or the like) by employing the first pre-process (e.g., method 400; see above, FIGS. 4A-4B) and the second pre-process (e.g., method 500; see above, FIGS. 5A-5B) to allow for a smarter and faster system that does not have to search blindly for ignition parameters, impedance tuning parameters, and signal generator output power each time the plasma process is run. As plasma process steps may occur over times in a range of less than a second to ten seconds, it is advantageous that the plasma power reaches the desired setpoint in a fast and repeatable manner to reduce or prevent discrepancies between process steps and to efficiently utilize cycle time and increase system throughput. Also, since the RF source system 200 and methods 400, 500, 600, and 700 do not use physically moving parts (e.g., variable capacitors of the matching circuit 212) during the actual plasma process, which allows for high repeatability and speed. The RF source system 200 and methods 400, 500, 600, and 700 may also fit into existing plasma process workflows to allow for a higher level of process capabilities.

Additionally, if the plasma process uses different plasma frequencies and powers during different steps of the plasma process, the RF source system 200 may be set up to adjust for different parameters (e.g., different power setpoints or process frequencies) during the pre-process steps (see above, FIGS. 4A-5B). The RF source system 200 can record many different process recipes to avoid performing the pre-process steps again when reusing recipes.

Example embodiments of the disclosure are summarized here. Other embodiments can also be understood from the entirety of the specification as well as the claims filed herein.

Example 1. A method of performing a plasma process, the method including: generating, at an output of a signal generator, a first RF signal at a first frequency, the signal generator being coupled to a plasma chamber through a matching circuit; based on a feedback from the first RF signal, moving variable components of the matching circuit to fixed positions; generating, at the output of the signal generator, a second RF signal at a second frequency to ignite a plasma within the plasma chamber; and in response to detecting the plasma, switching the signal generator to output a third RF signal at the first frequency, the third RF signal sustaining the plasma, the plasma being configured to process a substrate loaded into the plasma chamber while holding the matching circuit at the fixed positions.

Example 2. The method of example 1, further including holding the matching circuit at the fixed positions while generating the second RF signal to ignite the plasma.

Example 3. The method of one of examples 1 or 2, where the feedback from the first RF signal is a feedback from a voltage-current (V-I) sensor on a radio-frequency (RF) signal pipe to the plasma.

Example 4. The method of one of examples 1 to 3, where the fixed positions are determined by a controller based on the feedback, the fixed positions being positions of constant delivered power to the plasma chamber.

Example 5. The method of example 4, where the controller is configured to execute a program including a machine learning model stored in a memory, the machine learning model including instructions to generate the second RF signal at the second frequency.

Example 6. The method of example 5, where the machine learning model further includes a database of recordings of previous plasma processes.

Example 7. The method of one of examples 1 to 6, where generating the second RF signal at the second frequency is performed after moving variable components of the matching circuit to fixed positions.

Example 8. A method of performing a plasma process, the method including: holding variable components of a matching circuit to fixed positions; determining an ignition frequency for igniting a plasma in a plasma chamber; generating, at an output of a signal generator, a first signal at the ignition frequency to ignite the plasma within the plasma chamber; and in response to detecting the plasma, switching the signal generator to output a second signal at a process frequency, the second signal sustaining the plasma while holding the variable components of the matching circuit to the fixed positions, the plasma being configured to process a substrate loaded into the plasma chamber.

Example 9. The method of example 8, where the fixed positions of the variable components are determined prior to determining the ignition frequency.

Example 10. The method of one of examples 8 or 9, where switching the signal generator to output the second signal includes performing frequency stepping.

Example 11. The method of one of examples 8 or 9, where switching the signal generator to output the second signal includes performing a frequency sweep.

Example 12. The method of example 11, where determining the ignition frequency includes performing a pendulum search method.

Example 13. The method of example 11, where determining the ignition frequency includes performing a sweep up method.

Example 14. The method of example 11, where determining the ignition frequency includes performing a sweep down method.

Example 15. The method of one of examples 11 to 14, where determining the ignition frequency includes holding the variable components of the matching circuit to the fixed positions.

Example 16. The method of one of examples 11 to 15, where determining the ignition frequency is performed by a controller programmed with a machine learning model stored in a memory of the controller, the machine learning model including saved accumulated data from previous plasma processes.

Example 17. A method of performing a plasma process, the method including: powering a plasma chamber at a process frequency based on an output of a signal generator, the signal generator being coupled to the plasma chamber through a matching circuit; determining a delivered power from the signal generator to the plasma chamber; determining a configuration of the matching circuit based on the delivered power; determining, for the determined configuration of the matching circuit, an ignition frequency for igniting a plasma in the plasma chamber; igniting the plasma at the ignition frequency within the plasma chamber; and after the igniting, powering the plasma in the plasma chamber at the process frequency, the plasma being configured to process a substrate loaded into the plasma chamber.

Example 18. The method of example 17, further including exposing the substrate loaded into the plasma chamber to the plasma while holding the matching circuit at the determined configuration.

Example 19. The method of one of examples 17 or 18, where powering the plasma in the plasma chamber further includes regulating the delivered power from the signal generator with feedback from a VI probe.

Example 20. The method of one of examples 17 to 19, where, prior to determining the ignition frequency, power from the signal generator is turned off after determining the configuration of the matching circuit.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure. It should be appreciated that the physical arrangement and disposition of the components in the various embodiments of, for example, the plasma processing system are non-limiting.

What is claimed is:

1. A method of performing a plasma process, the method comprising:
generating, at an output of a signal generator, a first RF signal at a first frequency, the signal generator being coupled to a plasma chamber through a matching circuit;
based on a feedback from the first RF signal, the feedback comprising a signal from an optical sensor coupled with the plasma chamber, moving variable components of the matching circuit to fixed positions;

generating, at the output of the signal generator, a second RF signal at a second frequency to ignite a plasma within the plasma chamber; and
in response to detecting the plasma, switching the signal generator to output a third RF signal at the first frequency, the third RF signal sustaining the plasma, the plasma being configured to process a substrate loaded into the plasma chamber while holding the matching circuit at the fixed positions.

2. The method of claim 1, further comprising holding the matching circuit at the fixed positions while generating the second RF signal to ignite the plasma.

3. The method of claim 1, wherein the feedback from the first RF signal further comprises a feedback from a voltage-current (V-I) sensor on a radio-frequency (RF) signal pipe to the plasma.

4. The method of claim 1, wherein the fixed positions are determined by a controller based on the feedback, the fixed positions being positions of constant delivered power to the plasma chamber.

5. The method of claim 4, wherein the controller is configured to execute a program comprising a machine learning model stored in a memory, the machine learning model comprising instructions to generate the second RF signal at the second frequency.

6. The method of claim 5, wherein the machine learning model further comprises a database of recordings of previous plasma processes.

7. The method of claim 1, wherein generating the second RF signal at the second frequency is performed after moving variable components of the matching circuit to fixed positions.

8. A method of performing a plasma process, the method comprising:
holding variable components of a matching circuit to fixed positions;
determining an ignition frequency for igniting a plasma in a plasma chamber with a controller programmed with a machine learning model stored in a memory of the controller, the machine learning model including saved accumulated data from previous plasma processes;
generating, at an output of a signal generator, a first signal at the ignition frequency to ignite the plasma within the plasma chamber; and
in response to detecting the plasma using a photodiode coupled with the plasma chamber, switching the signal generator to output a second signal at a process frequency, the second signal sustaining the plasma while holding the variable components of the matching circuit to the fixed positions, the plasma being configured to process a substrate loaded into the plasma chamber.

9. The method of claim 8, wherein the fixed positions of the variable components are determined prior to determining the ignition frequency.

10. The method of claim 8, wherein switching the signal generator to output the second signal comprises performing frequency stepping.

11. The method of claim 8, wherein switching the signal generator to output the second signal comprises performing a frequency sweep.

12. The method of claim 11, wherein determining the ignition frequency comprises performing a pendulum search method.

13. The method of claim 11, wherein determining the ignition frequency comprises performing a sweep up method.

14. The method of claim 11, wherein determining the ignition frequency comprises performing a sweep down method.

15. The method of claim 11, wherein determining the ignition frequency comprises holding the variable components of the matching circuit to the fixed positions.

16. A method of performing a plasma process, the method comprising:

powering a plasma chamber at a process frequency based on an output of a signal generator, the signal generator being coupled to the plasma chamber through a matching circuit;

determining a delivered power from the signal generator to the plasma chamber;

determining a configuration of the matching circuit based on the delivered power;

determining, for the determined configuration of the matching circuit, an ignition frequency for igniting a plasma in the plasma chamber;

igniting the plasma at the ignition frequency within the plasma chamber;

receiving feedback on ignition of the plasma from an optical emission spectrometer coupled with the plasma chamber; and after the igniting, powering the plasma in the plasma chamber at the process frequency, the plasma being configured to process a substrate loaded into the plasma chamber.

17. The method of claim 16, further comprising exposing the substrate loaded into the plasma chamber to the plasma while holding the matching circuit at the determined configuration.

18. The method of claim 16, wherein powering the plasma in the plasma chamber further comprises regulating the delivered power from the signal generator with feedback from a VI probe.

19. The method of claim 16, wherein, prior to determining the ignition frequency, power from the signal generator is turned off after determining the configuration of the matching circuit.

20. The method of claim 8, wherein the machine learning model is generated to be specific to the plasma chamber.

* * * * *